United States Patent [19]

Aomura

[11] Patent Number: 4,988,639
[45] Date of Patent: Jan. 29, 1991

[54] METHOD OF MANUFACTURING SEMICONDUCTOR DEVICES USING TRENCH ISOLATION METHOD THAT FORMS HIGHLY FLAT BURIED INSULATION FILM

[75] Inventor: Kunio Aomura, Tokyo, Japan

[73] Assignee: NEC Corporation, Japan

[21] Appl. No.: 414,111

[22] Filed: Sep. 28, 1989

[30] Foreign Application Priority Data

Sep. 28, 1988 [JP] Japan .................. 63-245001

[51] Int. Cl.⁵ ............... H01L 21/461; H01L 21/76
[52] U.S. Cl. ........................ 437/67; 437/31; 437/33; 156/648
[58] Field of Search .............. 437/67, 31, 33; 156/648

[56] References Cited

U.S. PATENT DOCUMENTS

| 4,338,138 | 7/1982 | Cavaliere | 437/31 |
| 4,394,196 | 7/1983 | Iwai | 156/648 |
| 4,454,647 | 6/1986 | Joy | 437/31 |
| 4,551,911 | 11/1985 | Sasaki | 437/31 |

FOREIGN PATENT DOCUMENTS

| 53-38981 | 4/1978 | Japan | 437/31 |
| 60-211958 | 10/1985 | Japan | 437/67 |
| 64-25470 | 1/1989 | Japan | 437/31 |

OTHER PUBLICATIONS

1982 IEEE International Solid-State Circuits Conference/Friday, Feb. 12, 1982, Session XVII: Device Structures and Technology, "FAM 17.6:1.25 μm Deep-Groove-Isolated Self-Aligned ECL Circuits".

Primary Examiner—Olik Chaudhuri
Assistant Examiner—Ourmazd S. Ojan
Attorney, Agent, or Firm—Laff, Whitesel, Conte & Saret

[57] ABSTRACT

In a method of manufacturing semiconductor devices employing a trench isolation method in which trenches of different depth are formed in a silicon body and insulating materials are filled in these trenches, there is described the manufacturing method having a step of forming a first depth trench, filling with a first insulating material in the first depth trench, forming a second depth trench, which is formed relatively shallow and adjoins at least a part of the first trench and filling with a second insulating material in the second depth trench.

17 Claims, 8 Drawing Sheets

METHOD OF MANUFACTURING SEMICONDUCTOR DEVICES USING TRENCH ISOLATION METHOD THAT FORMS HIGHLY FLAT BURIED INSULATION FILM

BACKGROUND OF THE INVENTION

1. Field of the Invention

This invention relates to the method of manufacturing semiconductor devices and more particularly to the method of manufacturing an electrically isolated region of buried groove type between circuit elements.

2. Description of the Related Art

The well known methods of electrically isolating from one another the circuit elements such as transistors used in semiconductor devices include a PN junction isolation which makes use of the PN junction, an oxide isolation which selectively oxides regions between circuit elements and a trench isolation which forms trenches in the semiconductor substrate and fills the trenches with an insulating material. Of these methods, the trench isolation is finding a greater use because of its ability to define small sizes of isolated regions and at the same time provide a more reliable electrical isolation, contributing to increasing the circuit density of the semiconductor devices. A bipolar device to which the trench isolation method is applied is illustrated, for example, in FIG. 1 of 1982 IEEE International Solid-State Circuits Conference/FRIDAY, FEB. 12, 1982/SESSION XVII: DEVICE STRUCTURES AND TECHNOLOGY "FAM 17.6:1.25μm Deep-Groove-Isolated Self-Aligned ECL Circuits." In FIG. 1 the isolation grooves of different depths are filled with insulating material in such a manner that the surfaces of the buried insulating material are flat. However, no technique has been proposed as to the method of manufacturing such an isolation structure which has flat surfaces of the insulating material and which can increase circuit density.

Especially when insulating material is to be buried in trenches (grooves) of different depths, as shown in the above technical literature, the insulating material may not be buried in a satisfactory condition due to steps formed at the bottom of the trenches. This may result in poor isolation performance or insufficient surface flatness of the buried insulating material, which in turn may cause a break of the upper electric wiring on the surface. Another problem is that in a relatively wide isolation region, the insulating film formed in this region is relatively thin, so that a larger parasitic capacitance is formed between the upper electric wiring and the substrate silicon layer via the insulating film, reducing the operation speed of the semiconductor device.

SUMMARY OF THE INVENTION

The object of this invention is to provide a method of manufacturing semiconductor devices whereby the insulating material can be buried in isolation trenches of different depths formed between circuit elements in such a way that the insulating performance and the surface flatness of the insulating material thus buried are high, and the parasitic capacitance of the wirings formed on the wide isolation region can be reduced.

This invention provides a method of manufacturing semiconductor devices which comprises the steps of: forming a first mask having an opening at a first region on the surface of a silicon body; etching the silicon body through the first mask to form a trench of a first depth in the first region; filling a first insulating material in the first-depth trench; forming a second mask having an opening which extends continuously from a second region adjacent to the first region on the surface of the silicon body to at least a part of the first region; etching the silicon body through the second mask to form a trench of a second depth only in the second region; and filling a second insulating material in the second-depth trench.

Since, with this method, after the first-depth trench is filled with the first insulating material, the second-depth trench is formed adjacent to the first trench and is filled with the second insulating material, it is possible to form an isolation region in which there are no complex steps at the bottom of the trenches and which has high surface flatness and insulation performance. Therefore, the possibility of the wirings formed on the isolation region being broken due to uneven surface can be reduced. Furthermore, by applying the filled-trench type isolation technique of this invention to the entire area of the isolation region other than the circuit element formation region, it is possible to suppress the parasitic capacitance of the upper wirings formed on the isolation region. Particularly in a wide isolation region, the parasitic capacitance of the upper wirings on the isolation region can be substantially reduced by forming several strips of the first-depth trenches and also forming the second-depth trenches in the entire isolation region including the first-depth trenches. In forming the second-depth trench, the first insulating material as well as the second mask works as an etching mask, so that it is not necessary to form the pattern of the second mask on the first region with high level of precision. This makes the formation of the mask easy.

BRIEF DESCRIPTION OF THE DRAWINGS

The aforementioned objects, features and advantages of the present invention will become more aparrent from the following detailed description taken in conjunction with the accompanying drawings, wherein.

DESCRIPTION OF THE PRIOR ART

The conventional technique of forming the isolation regions as applied to bipolar transistors will be explained by referring to FIGS. 1a to 1f and FIGS. 2a and 2b. FIGS. 1a to 1f represent the cross sections of a semiconductor device taken along the line A—A' in FIG. 2a, which is a plan view of the semiconductor device. FIG. 2b is a cross section of the semiconductor device being processed, taken along the line B—B' of FIG. 2a.

Figure 1A:
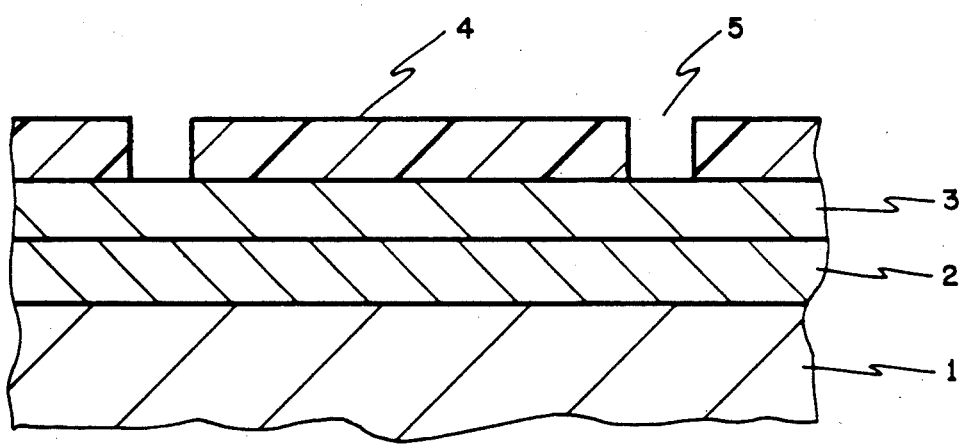
FIGS. 1a to 1f are cross sections showing the process of manufacturing the filled-trench type isolation region according to a conventional technique.

As shown in FIG. 1a, an N-type impurity such as arsenic (As) or antimony (Sb) is introduced into the surface layer of the P-type silicon substrate 1 and an N-type epitaxial layer is grown upon the introduced surface layer. This provides a silicon body that has an N⁻ type epitaxial layer 3 of 1 μm in thickness with low impurity concentration, formed on the N⁺ type buried layer 2 of about 2 μm in thickness with high impurity concentration.

Next, a first masking layer 4 for the silicon etching process is formed and the masking layer 4 is patterned to selectively form openings 5 therethrough. It is preferred that the masking layer 4 be formed of a multilayer film consisting of a silicon oxide film and a photoresist film.

Figure 1B:
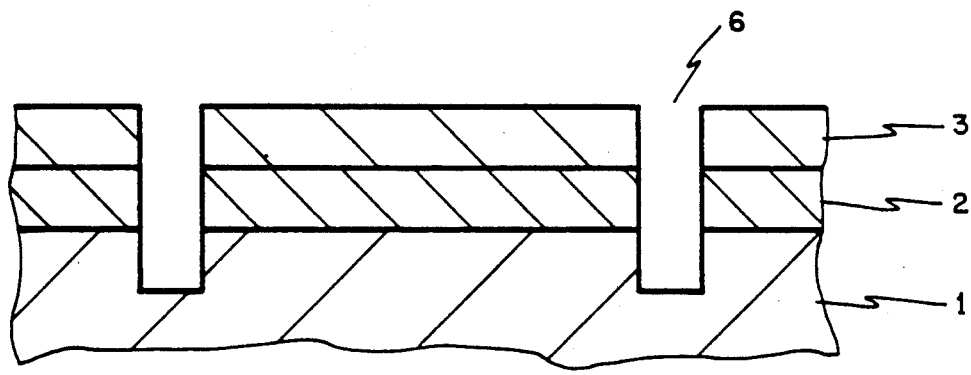

Then, as shown in FIG. 1b, selective etching is done on the silicon body through the first masking layer 4 to form a first trench 6 of about 5 μm in depth that reaches the P-type silicon substrate 1. The masking layer 4 is then removed.

Figure 1C:
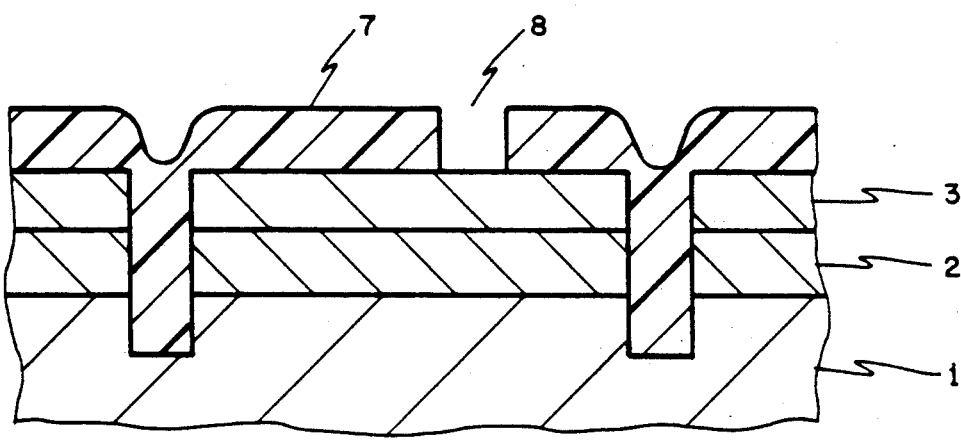

Next, as shown in FIG. 1c, a second masking layer 7 with openings 8 is selectively formed over the surface of the silicon body.

Figure 1D:
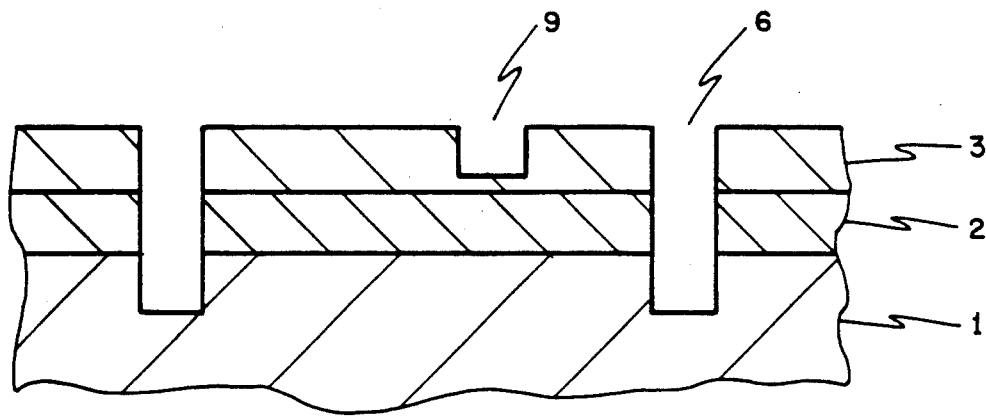

As shown in FIG. 1d, by utilizing the masking layer 7 the silicon body is selectively etched to form a second trench 9 into the N⁻ type epitaxial layer 3 so that the bottom of the trench 9 will at most arrive to the surface of the N⁺ type buried layer 2. The masking layer 7 is then removed.

Figure 1E:
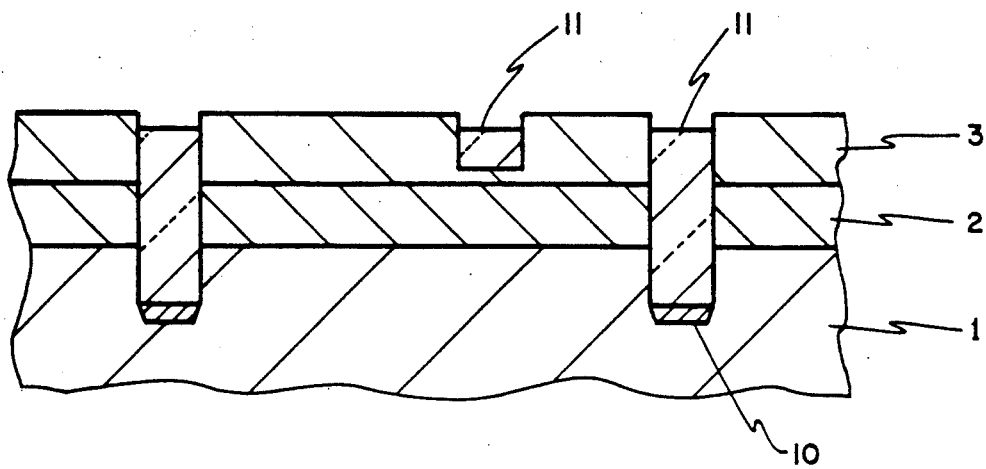

Then, as shown in FIG. 1e, a P-type impurity is introduced at the bottom of the first trench 6 to form a P⁺ type channel stopper region 10. This is followed by an insulating material 11 being filled into the first trench 6 and the second trench 9. The material used as the insulating material 11 generally consists mainly of oxides in a vapor growth.

Figure 1F:
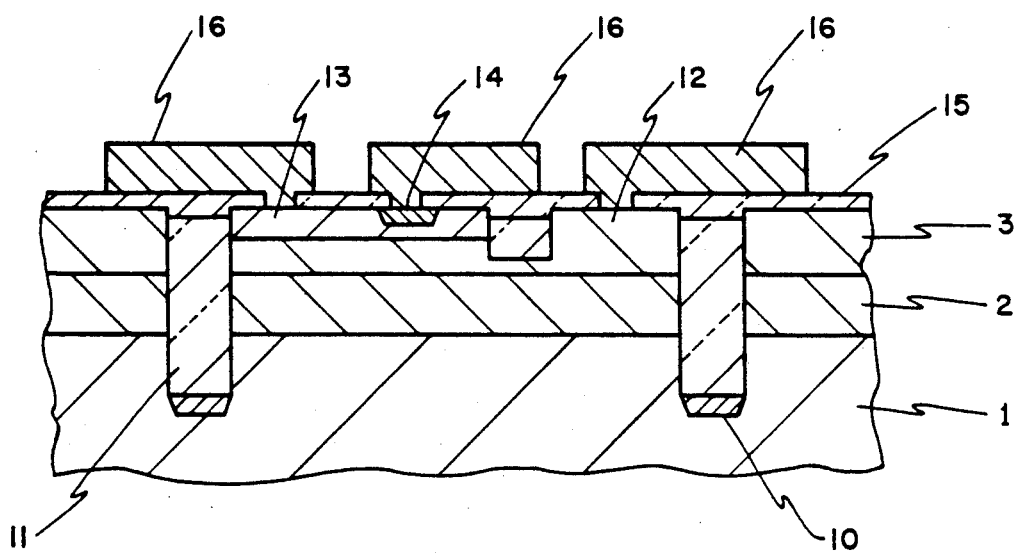

Next, as shown in FIG. 1f, the collector region 12 the base region 13, and the emitter region 14 are formed successively. An insulating film 15 is formed over the surface of the silicon body and is formed with openings that correspond to each of these regions. Through these openings, electrode wirings 16 are formed. Now, the bipolar transistor having the filled-trench type isolation region is obtained.

Figure 2A:
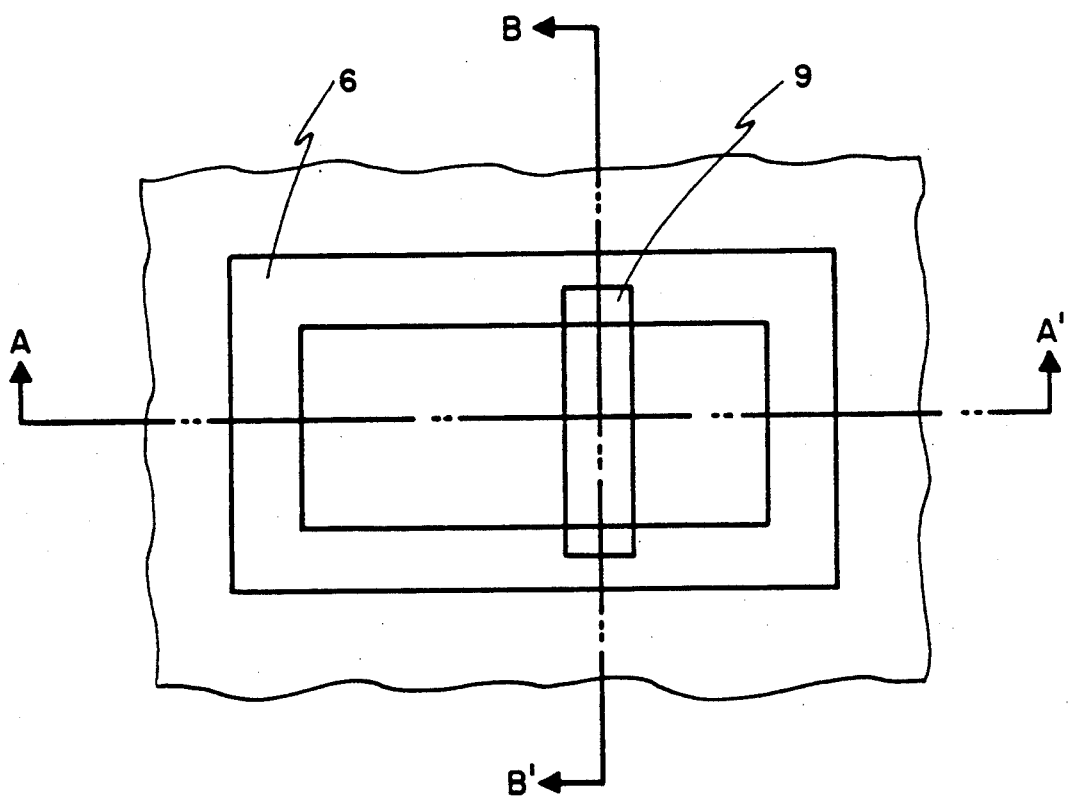
FIG. 2a is a plan view of a semiconductor device in the process of FIG. 1d.
Figure 2B:
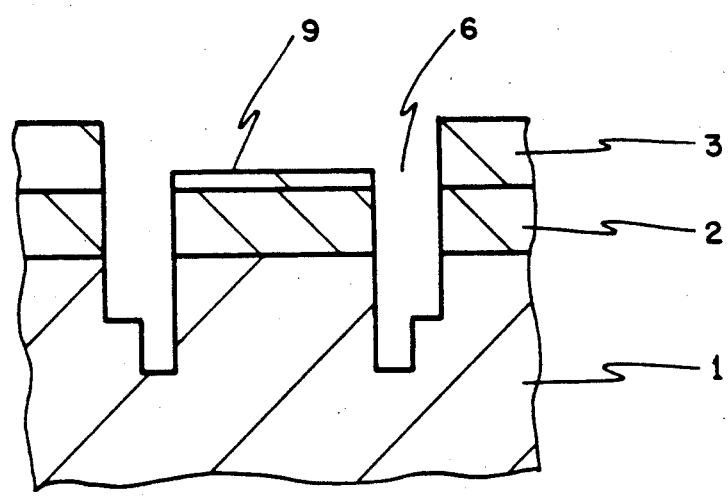
FIG. 2b is another cross section of the semiconductor device in the process of FIG. 1d.

A series of manufacturing steps described above involves consecutive etching processes in forming the first trench 6 and the second trench 9, both having different depths. The plan view of the semiconductor device, which is in the process of FIG. 1d where the first and the second trenches 6, 9 are formed, is as shown in FIG. 2a. The mask pattern used to form the second trench 9 over the first trench 6, which was already formed in the preceding process, is formed with a predetermined dimensional margin. Thus, as shown in FIG. 2b, where the mask patterns to form the first trench 6 and the second trench 9 overlap each other, the silicon body is etched to a greater depth, forming a step at the bottom of the trench, making the shape of the trench bottom complex. It is therefore very difficult to fill the same insulating material 11 in the first trench 6 and the second trench 6 at one time, both with complex shapes and different depths, in the process of FIG. 1e, and have the surface of the insulating material 11 almost flush with the surface of the silicon body and sufficiently flatness. This will lead to a failure to correctly fill the insulating material in the trenches or to correctly form the channel stopper region at the bottom of the trench, resulting in deteriorated insulation characteristics. Furthermore, since the surface of the filled insulating material is not sufficiently flat, the upper wiring on the surface may be broken and opened, deteriorating the reliability of the semiconductor device.

Moreover, since the surface of the silicon body except for the filled-trench type isolation region is only covered with a thin insulating film 15, there is the drawback that a larger capacitance is formed between the electrode wiring 16 connected to each of the regions of the bipolar transistor and the silicon body other than the bipolar transistor area, deteriorating the operation speed of the transistor.

DETAILED DESCRIPTION OF THE PREFERRED EMBODIMENTS

Now, by referring to the accompanying drawings, we will explain the preferred embodiments of the present invention.

Figure 3A:
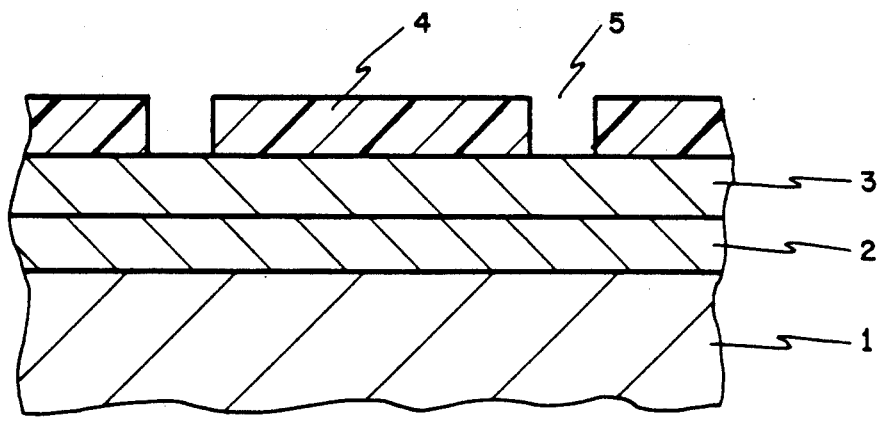
FIGS. 3a to 3f are cross sections showing the manufacturing process according to a first embodiment of the present invention.
Figure 3B:
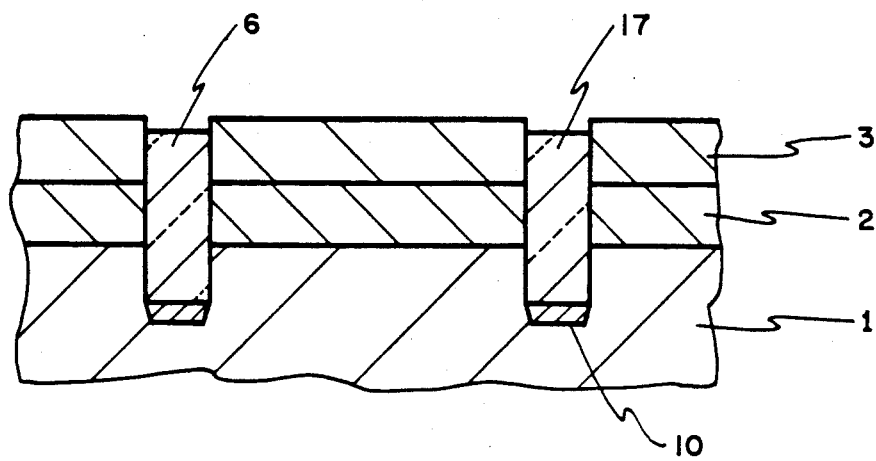
Figure 3C:
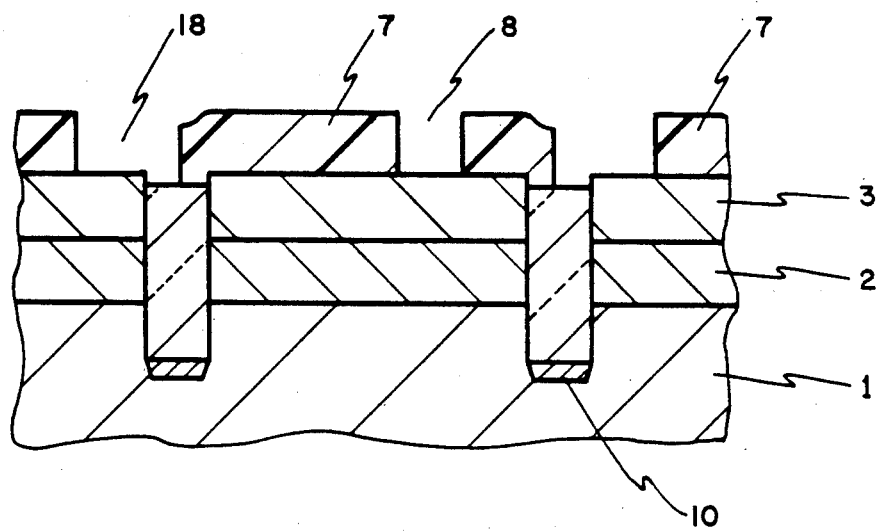
Figure 3D:
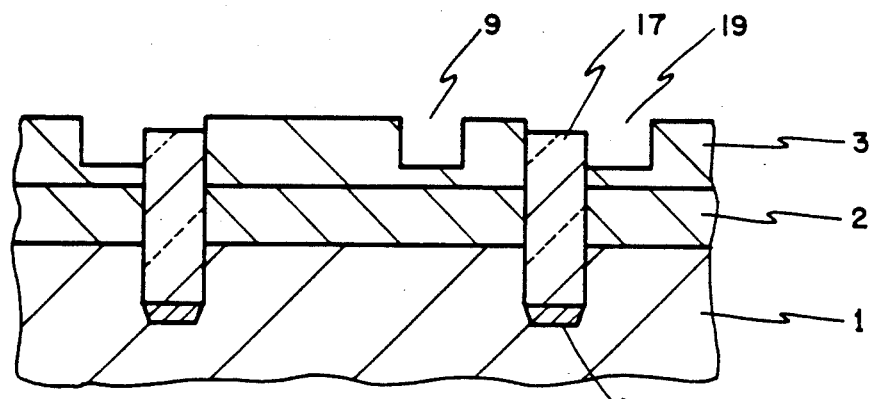
Figure 3E:
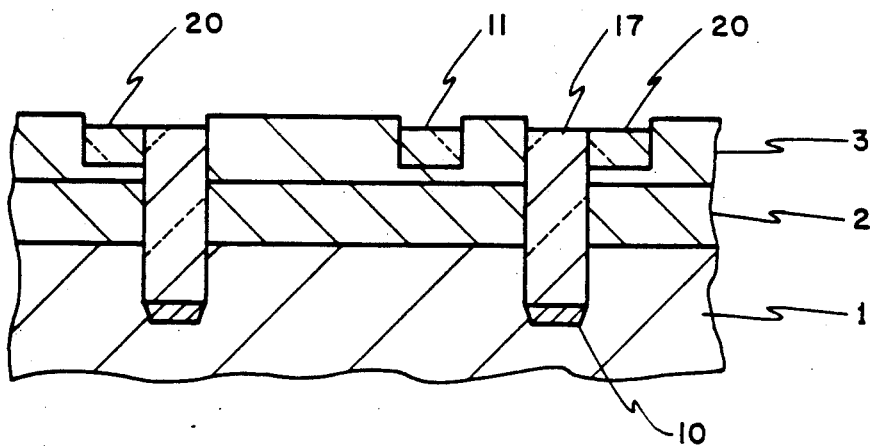
Figure 3F:
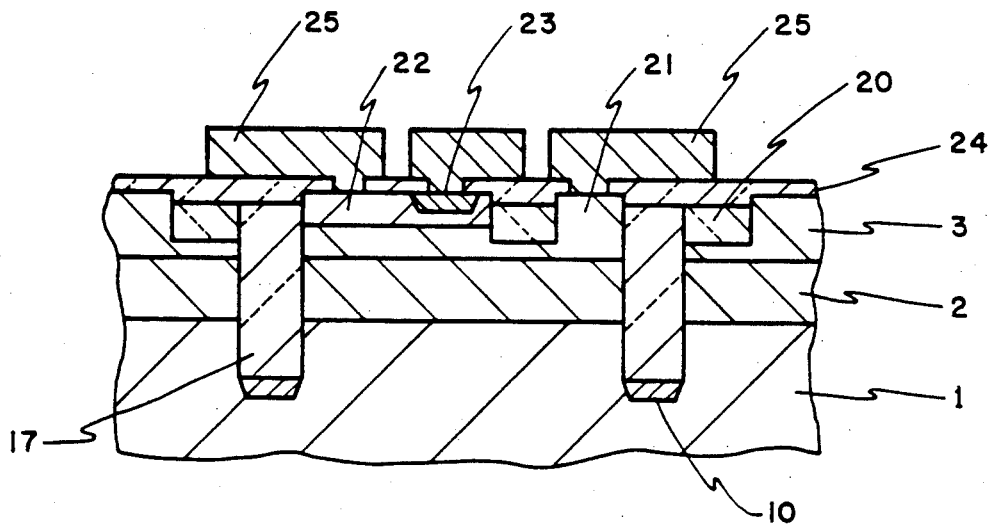
Figure 4A:
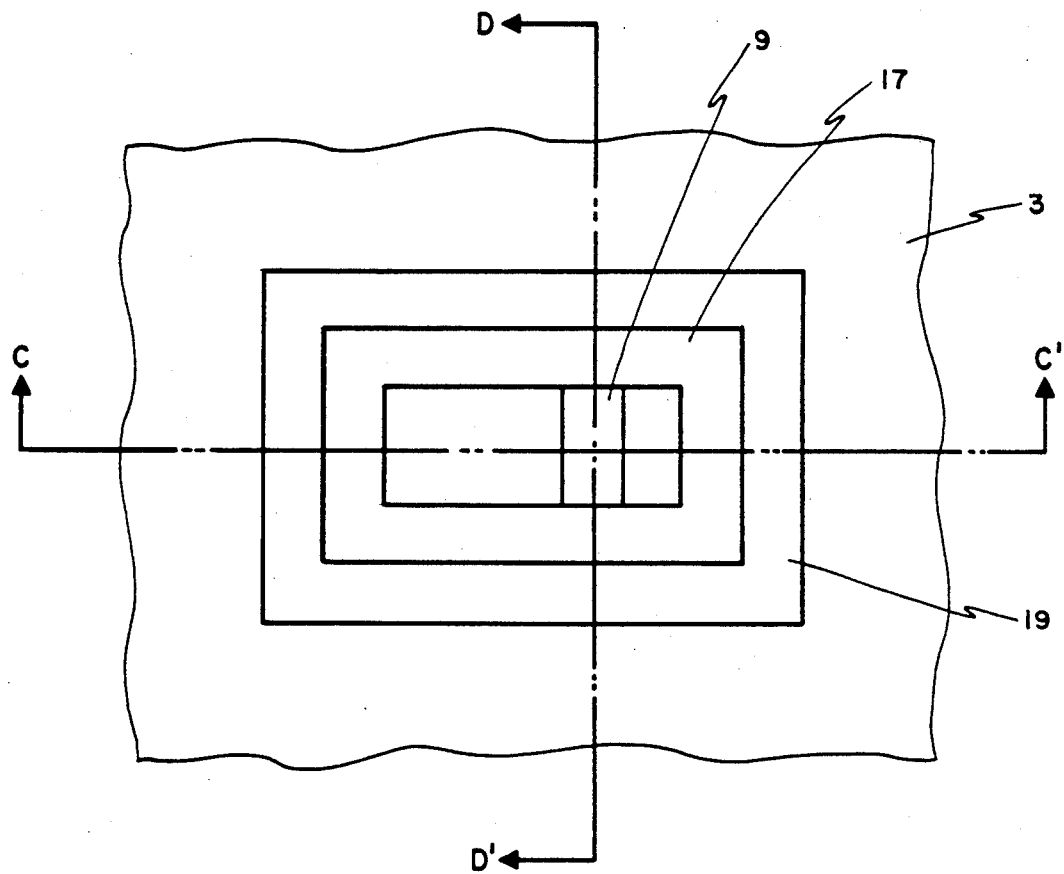
FIG. 4a is a plan view of a semiconductor device in the process of FIG. 3d.
Figure 4B:
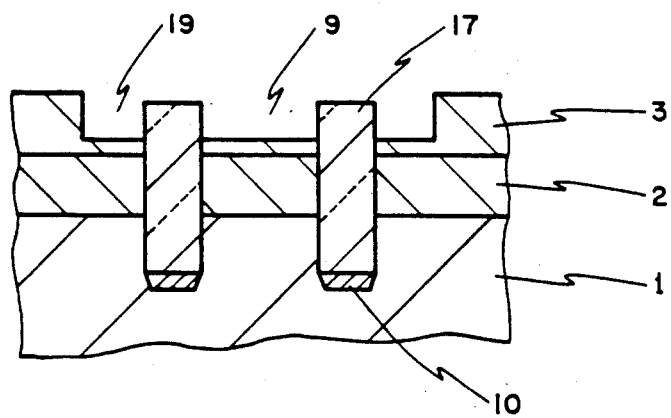
FIG. 4b is another corss section of the semiconductor device in the process of FIG. 3d.

The embodiment in which the isolation technique of the present invention is applied to the bipolar transistor is described by referring to FIGS. 3a to 3f and FIGS. 4a and 4b. FIGS. 3a to 3f represent cross sections of a semiconductor device in each process, taken along the line C—C' of FIG. 4a, which is a plan view of the device. FIG. 4b is a cross section of the semiconductor device being processed, taken along the line D—D' of FIG. 4a.

Like the conventional technique, the method of the present invention first introduces an N-type impurity such as arsenic or antimony into the surface of the P-type silicon substrate 1 as shown in FIG. 3a. Then, an N-type epitaxial layer is grown upon the doped surface to form a silicon body which has an N⁻ type epitaxial layer 3 of 1 μm in thickness with low impurity concentration formed over the N⁺ type buried layer 2 of about 2 μm in thickness with high impurity density. Then, a masking layer 4 for the silicon etching process is formed, which is selectively formed with openings 5. The impurity density of the N⁺ type buried layer 2 is preferably $5 \times 10^{18}$ cm⁻³ and that of the N⁻ type epitaxial layer 3 is $1 \times 10^{16}$ cm⁻³, and it is preferred that the masking layer 4 be formed of a multilayer film made of a silicon oxide film and a photoresist film.

The next step is shown in FIG. 3b, in which the silicon body is selectively etched through the masking layer 4 to form a first trench 6 that reaches the P-type silicon substrate 1. Then the masking layer 4 is removed. A P-type impurity is introduced at the bottom of the first trench 6 to form a P⁺ type channel stopper region 10, after which a first insulating material 17 is filled into the first trench 6. The first insulating material 17 is preferably formed mainly of an oxide material including phosphorus or a combination of phosphorus and boron, in vapor growth.

Next, as shown in FIG. 3c, a masking layer 7 is again formed over the surface of the silicon body and is selectively formed with openings 8 and 18. In this embodiment, the masking layer 7 has two kinds of openings, i.e., an opening 18 which extends from the first trench 6 and the first buried insulating material 17 toward the outside of the transistor area, and an opening 8 which separates the future base region from the collector electrode leadout region.

Then, as shown in FIG. 3d and FIGS. 4a and 4b, by using the masking layer 7 and the already buried first insulating material 17 as a mask, the N⁻ type epitaxial layer 3 of the silicon body is selectively etched to form second trenches 9 and 19. After this, the masking layer 7 is removed.

Next, in FIG. 3e, the second trenches 9 and 19 are filled with second insulating materials 11 and 20 simultaneously, the insulating materials being made of the same material. The second insulating materials 11 and 20 may or may not be the same as the first insulating material 17. It is also possible to form the second insulating materials 11 and 20 in such a way as to cover the surface of the first insulating material 17.

Then, in FIG. 3f, a collector region 21, a base region 22 and an emitter region 23 are formed successively. After this, an insulating film 24 is formed over the surface of the silicon body. Through specified openings formed in the insulating film 24, electrode wirings 25 that connect to each region of the transistor are formed, thus completing the semiconductor device.

With this embodiment, as shown in FIG. 3d and FIGS. 4a and 4b, when the second trenches 9 and 19 are formed, the first insulating material 17 which was already buried works as the etching mask along with the masking layer 7, so that the formation of the second trenches 9 and 19 will not produce a step at the bottom of the trenches where the first and the second trenches overlap. Thus there is no chance of the trenches with complex shapes and differing depths being formed, as would occur when the conventional technique was used. The trenches formed by the method of this invention will have uniform depths. This in turn makes it easy to maintain the flatness of the surface of the second insulating material 11 when burying them in the trenches, thereby preventing the break of electrode wirings 25 formed on the surface. Furthermore, this invention prevents reduction in insulation, which would be caused by the complex shape at the bottom of the trenches formed with the conventional technique. This in turn leads to improved reproducibility, yields, and reliability in the manufacturing process.

In addition, as shown in FIG. 3f, since the second insulating material 20 is also buried thick in the region adjacent to the first insulating material 17 on the outside of the bipolar transistor formation region, no large parasitic capacitance will be formed between the electrode wirings 25 and the silicon body, thus improving the operation characteristic of the semiconductor device.

Next, we will explain about this invention as applied to the isolation region with a large area, by referring to FIGS. 5a to 5f.

Figure 5A:
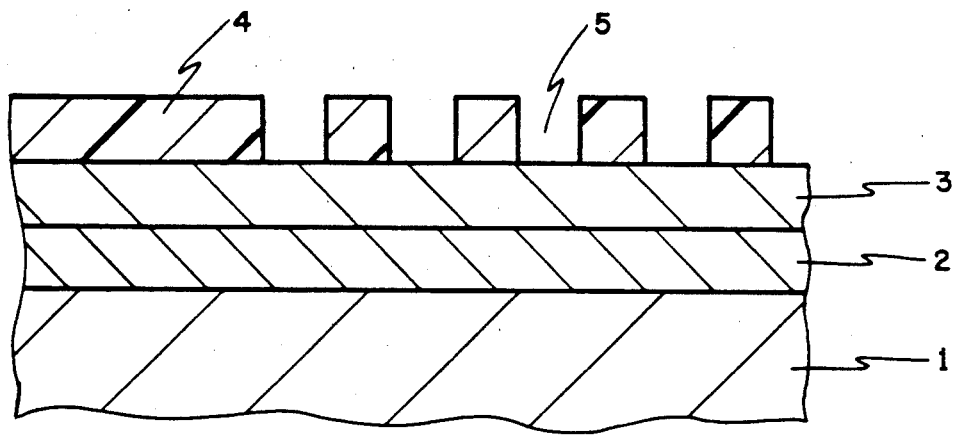
FIGS. 5a to 5f are cross sections showing the manufacturing process according to a second embodiment of the present invention.

As shown in FIG. 5a, like the conventional technique, an N+ type layer 2 of high concentration antimony is buried over the surface of the P-type silicon substrate 1. On the surface of the N+ type layer 2, an N− type epitaxial layer 3 is grown to manufacture a silicon body. Then, a masking layer 4 for silicon etching is formed over the surface of the silicon body and is selectively formed with openings 5. The concentration and thickness of the epitaxial layer 3 as well as the details of the masking layer 4 are the same as those of the preceding embodiment.

Figure 5B:
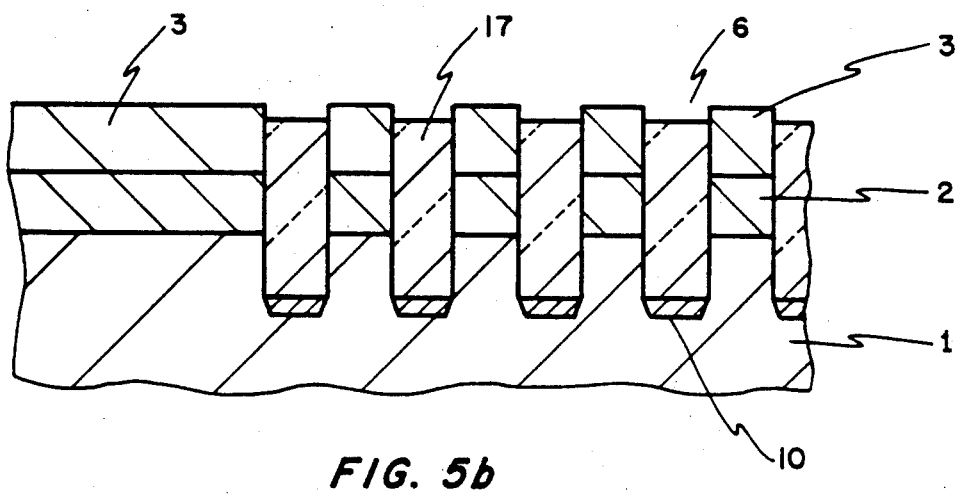

Next, as shown in FIG. 5b, through the masking layer 4 the silicon body is selectively etched to form a plurality of first trenches down into the P-type silicon substrate 1. The masking layer 4 is then removed. The depth of the first trenches 6 is equal to that of the preceding embodiment. At the bottom of the first trench 6 a P+ type channel stopper region 10 is formed. And then a first insulating material 17 is buried into the first trenches 6. The insulating material 17 is the same as that of the preceding embodiment.

Figure 5C:
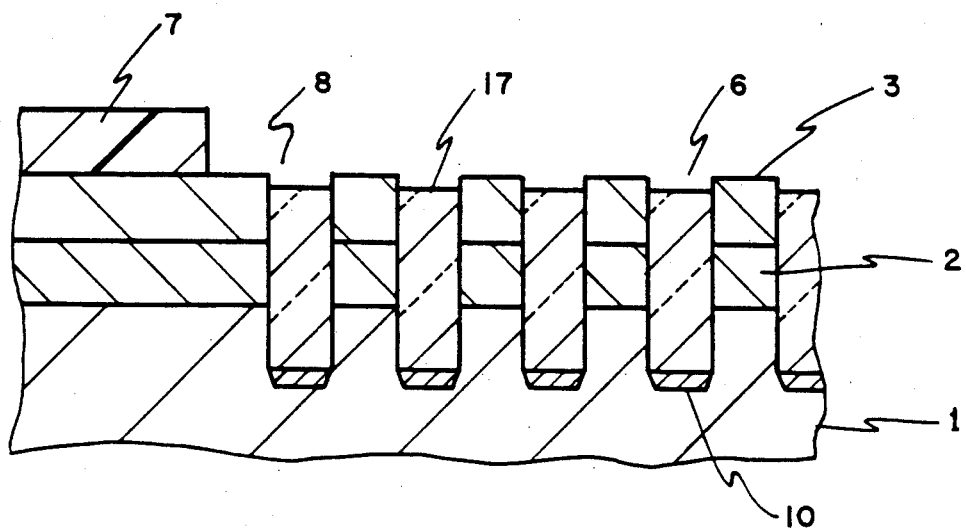

Then, as shown in FIG. 5c, a masking layer 7 is selectively formed over the surface of the silicon body. In this embodiment, to reduce the direct opposing area between the silicon body and the electrode wirings and thereby minimize the parasitic capacitance, a plurality of strips of the insulating material 17 are arranged at appropriate intervals, with second trenches formed therebetween. For this purpose, the masking layer 7 is formed with a wide opening 8 that encompasses the first trenches 6.

Figure 5D:
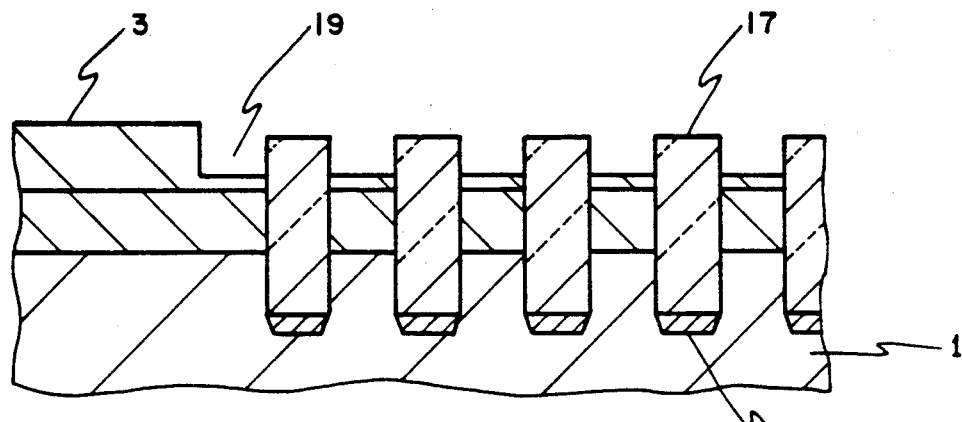

In FIG. 5d, with the masking layer 7 and the first insulating material 17 used as a mask, the silicon body is selectively etched to form a second trench 19 in the N− type epitaxial layer 3. Then the masking layer 7 is removed.

Figure 5E:
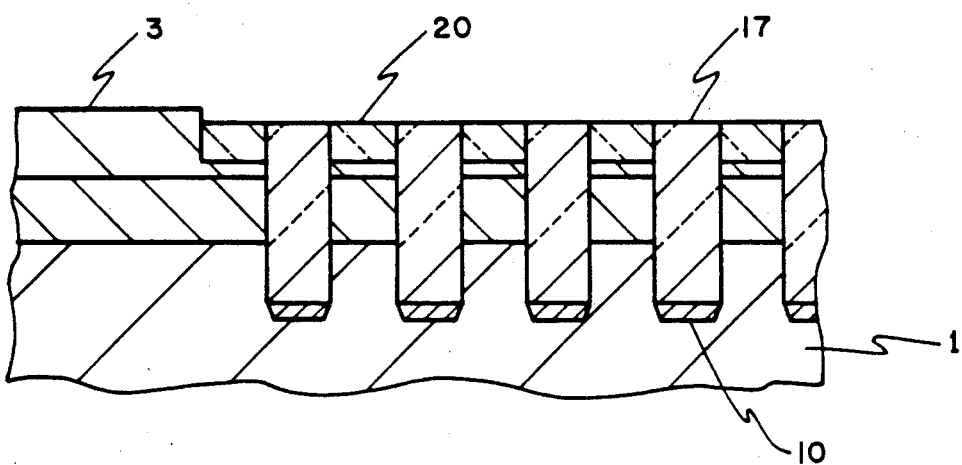

Then, as shown in FIG. 5e, a second insulating material 20 is buried into the second trench 19. The second insulating material 20 may or may not be the same as the first insulating material 17. Like the preceding embodiment, it is also possible to form the second insulating material 19 so that it covers the surface of the first insulating material 17.

Figure 5F:
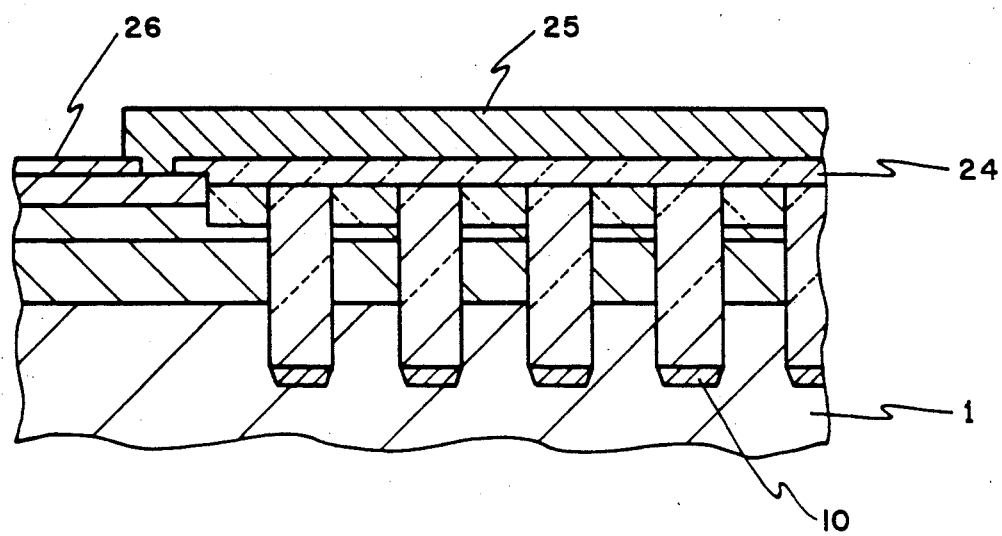

Next, as shown in FIG. 5f, a P-type resistor region 26 is formed and then the surface of the silicon body is covered with an insulating film 24, which has openings. Through the openings in the insulating film 24, electrode wirings 25 to the resistor region 26 are formed, thereby completing the semiconductor device.

Since in this embodiment thick insulating materials formed of the first insulating material 17 and the second insulating material 20 are provided under the electrode wirings 25, the direct opposing area between the electrode wirings 25 and the silicon layer is substantially reduced, which in turn reduces the parasitic capacitance produced in the isolation region as a whole.

As mentioned in the foregoing, since in this invention the semiconductor body is formed with the first trench which is then filled with the first insulating material, formation of a masking layer for the second trench becomes easy. With the second trench formed, the final trenches obtained have simple shapes and uniform depths, while with the conventional technique the final trenches would have complex shape and differing depths. Thus, the second insulating material can easily be buried. Therefore, a satisfactory isolation region can easily be formed with high reproducibility and yield, which in turn makes it possible to provide semiconductor devices with high reliability suitable for increasing the circuit density. Moreover, since a thick and wide isolation region can be formed on the semiconductor body, the parasitic capacitance formed between the electrode wirings and the silicon body is greatly reduced, allowing for increased operation speed of the semiconductor device.

What is claimed is:

1. A method of manufacturing a semiconductor device comprising the steps of:
   forming a first mask over the surface of a silicon body, said first mask having an opening at a first region on the surface of said silicon body;
   etching said silicon body through said first mask to form a first trench of a first depth in said first region on said silicon body;
   filling a first insulating material in said first trench;
   forming a second mask over the surface of said silicon body, said second mask having a first opening which simultaneously extends continuously from a second region adjacent to said first region on the silicon body surface to a part of the first region and a second opening;

etching the silicon body through said mask to simultaneously form a second trench of a second depth only in said second region on the silicon body and a third trench of said second depth on the silicon body; and simultaneously filling a second insulating material in said second and third trenches.

2. A method of manufacturing a semiconductor device as set forth in claim 1, wherein said silicon body has a structure in which a high impurity-concentration of silicon layer and a low impurity-concentration of silicon layer are formed one upon the other on a silicon substrate.

3. A method of manufacturing a semiconductor device as set forth in claim 1, wherein said first insulating material and said second insulating material are made of the same insulating material.

4. A method of manufacturing a semiconductor device as set forth in claim 1, wherein said first trench and said second trench are formed to different depths.

5. A method of manufacturing a semiconductor device as set forth in claim 1, wherein etching said silicon body through said first mask and the second mask is done by a dry etching method.

6. A method of manufacturing a semiconductor device as set forth in claim 1, wherein said second insulating material buried in said second trench formed adjacent to the first region is formed over the first insulating material buried in the first region.

7. A method of manufacturing a semiconductor device comprising the steps of:
forming a first trench of a first depth in a first region, the first region surrounding a specified device manufacturing area on a silicon body;
filling a first insulating material in said first trench;
simultaneously forming a second trench of a second depth in the silicon body at a second region and a third trench of said second depth in the silicon body at a third region apart from said second, the second region adjoining at least a part of the first region and provided outside of the semiconductor device manufacturing area;
simultaneously filling a second insulating material in said second and third trenches;
forming a specified circuit element region in the semiconductor device manufacturing region;
forming an insulating film over the entire surface of the silicon body, the insulating film having openings at the circuit element region; and
extending electrode wirings of specified shapes which are connected to the circuit element region through the openings over the insulating film on the first and second insulating materials located outside the semiconductor device manufacturing area.

8. A method of manufacturing a semiconductor device as set forth in claim 7, wherein the silicon body has a structure in which a high impurity-concentration of silicon layer and a low impurity-concentration of silicon layer are formed one upon the other on a silicon substrate.

9. A method of manufacturing a semiconductor device as set forth in claim 7, wherein the first insulating material and the second insulating material are made of the same insulating material.

10. A method of manufacturing a semiconductor device as set forth in claim 7, wherein said first trench and said second trench are formed to different depths.

11. A method of manufacturing a semiconductor device as set forth in claim 7/ wherein said second insulating material buried in said second trench formed adjacent to the first region is formed over the first insulating material buried in the first region.

12. A method of manufacturing a semiconductor device as set forth in claim 7, wherein said first trench formed outside the semiconductor device manufacturing area is formed as a plurality of strips of trenches and said second trench is formed at least between said first trenches.

13. A method of manufacturing a semiconductor device comprising the steps of:
forming a plurality of strips of first-depth trenches in a specified region between circuit regions on a silicon body;
filling a first insulating material in the first-depth trenches;
simultaneously forming a first second-depth trench on the entire surface of the silicon body in the region between the circuit regions except for where the first insulating materials are buried and a second second-depth trench on the surface of the circuit regions;
simultaneously filling a second insulating material in the first and second depth trenches;
forming an insulating film over the entire surface of the silicon body, the insulating film having openings at specified locations in first and second circuit element formation regions; and
forming electrode paths of arbitrary shapes, the electrode wirings extending from the opening in the first circuit element formation region to the opening in the second circuit element formation region and passing over the region between the circuit regions.

14. A method of manufacturing a semiconductor device as set forth in claim 13, wherein the silicon body has a structure in which a high impurity-concentration of silicon layer and a low impurity-concentration of silicon layer are formed one upon the other on a silicon substrate.

15. A method of manufacturing a semiconductor device as set forth in claim 13, wherein the first insulating material and the second insulating material are made of the same insulating material.

16. A method of manufacturing a semiconductor device as set forth in claim 13, wherein the first-depth trench and the second-depth trench are formed to different depths.

17. A method of manufacturing a semiconductor device as set forth in claim 13, wherein the second insulating material buried in the second-depth trench formed adjacent to the first region is formed over the first insulating material filled in the first region.

* * * * *